(12) United States Patent
Eustis et al.

(10) Patent No.: US 6,928,377 B2
(45) Date of Patent: Aug. 9, 2005

(54) SELF-TEST ARCHITECTURE TO IMPLEMENT DATA COLUMN REDUNDANCY IN A RAM

(75) Inventors: Steven M. Eustis, Essex Junction, VT (US); Krishnendu Mondal, Burlington, VT (US); Michael R. Ouellette, Westford, VT (US); Jeremy P. Rowland, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 10/658,940

(22) Filed: Sep. 9, 2003

(65) Prior Publication Data

US 2005/0055173 A1 Mar. 10, 2005

(51) Int. Cl.[7] .............................................. G01R 31/00
(52) U.S. Cl. ...................................... 702/118; 702/117
(58) Field of Search .............................. 360/26, 39, 47, 360/53; 365/185.09, 200, 201; 702/85, 108, 117, 118; 714/6, 7, 10, 11, 12, 41, 42, 710, 711, 733, 734, 758, 763, 33; 324/73.1

(56) References Cited

U.S. PATENT DOCUMENTS

| | | | |
|---|---|---|---|
| 4,460,997 A | * | 7/1984 | Harns ........................ 714/711 |
| 4,701,887 A | | 10/1987 | Ogawa |
| 5,337,318 A | * | 8/1994 | Tsukakoshi et al. ........ 714/708 |
| 5,355,340 A | * | 10/1994 | Coker et al. ................ 365/200 |
| 5,469,389 A | | 11/1995 | Olivo et al. |
| 5,506,807 A | | 4/1996 | Ferrant et al. |
| 5,621,691 A | | 4/1997 | Park |
| 5,831,915 A | | 11/1998 | Pascucci |
| 5,896,328 A | | 4/1999 | Tanizaki et al. |
| 5,999,450 A | | 12/1999 | Dallabora et al. |
| 6,115,300 A | | 9/2000 | Massoumi et al. |
| 6,134,142 A | | 10/2000 | Hirano |
| 6,327,197 B1 | | 12/2001 | Kim et al. |
| 6,366,508 B1 | | 4/2002 | Agrawal et al. |
| 6,373,758 B1 | * | 4/2002 | Hughes et al. ............. 365/200 |
| 6,408,401 B1 | * | 6/2002 | Bhavsar et al. ............... 714/7 |
| 6,426,902 B1 | | 7/2002 | Lee et al. |
| 6,445,626 B1 | | 9/2002 | Hsu et al. |
| 6,477,662 B1 | * | 11/2002 | Beffa et al. .................... 714/7 |
| 6,496,947 B1 | * | 12/2002 | Schwarz ...................... 714/30 |
| 6,571,348 B1 | | 5/2003 | Tsai et al. |
| 6,691,252 B2 | * | 2/2004 | Hughes et al. ............. 714/718 |
| 6,795,942 B1 | * | 9/2004 | Schwarz ..................... 714/718 |
| 2002/0108073 A1 | * | 8/2002 | Hughes ........................... 714/7 |

OTHER PUBLICATIONS

Ilyoung Kim; Zorian, Y; Komoriya, G; Pham, H.; Higgins, F; Lewandowski, J; "Built in self repair for embedded high density SRAM"; Proceedings. International Test Conference; Oct. 18–23, 1998; pp 1112–1119.*

Hyeokman Kwon; Joohyeong Moon; Jinsoo Byun; Sangwook Park; Jinyong Chung; "Linear search algoritm for repair analysis with 4 spare row/4 spare column"; Proceedings of the Second IEEE Asia Pacific Conference on ASICs; Aug. 28–30, 2000; pp 269–272.*

* cited by examiner

Primary Examiner—John Barlow
Assistant Examiner—Douglas N. Washburn
(74) Attorney, Agent, or Firm—Scully, Scott, Murphy & Presser; William H. Steinberg

(57) ABSTRACT

Self-test architectures are provided to implement data column and row redundancy with a totally integrated self-test and repair capability in a Random Access Memory (RAM), either a Dynamic RAM (DRAM) or a Static Ram (SRAM), and are particularly applicable to compileable memories and to embedded RAM within microprocessor or logic chips. The invention uses two passes of self-test of a memory. The first pass of self-test determines the worst failing column, the column with the largest number of unique failing row addresses. After completion of the first pass of self-test, the spare column is allocated to replace the worst failing column. In the second pass of self-test, the BIST (Built In Self-Test) collects unique failing row addresses as it does today for memories with spare rows only. At the completion of the second pass of self-test, the spare rows are then allocated. Once the second pass of self-test is completed, the column and unique failing row addresses are transported to the e-fuse macros and permanently stored in the chip.

15 Claims, 3 Drawing Sheets

SELF-TEST ARCHITECTURE TO IMPLEMENT DATA COLUMN REDUNDANCY IN A RAM

BACKGROUND OF THE INVENTION

1. Field of the Invention

The present invention relates generally to self-test architectures to implement data column redundancy in a Random Access Memory (RAM), either a Dynamic RAM (DRAM) or a Static RAM (SRAM), and is particularly applicable to compileable memories which are memories designed and compiled from basic building blocks termed kernels. The present invention is also particularly applicable to embedded RAM (eRAM) within microprocessor or logic chips, although it also has applicability to stand alone RAM chips.

More particularly, the subject invention pertains to self-test architectures to implement data column redundancy in a RAM memory that uses column and row redundancy with a totally integrated self-test and repair capability. A specific embodiment of a compileable 1-port SRAM is disclosed, although as noted the present invention has wider applicability to RAM memories in general, and in SRAM memories has wider applicability to dual-port or multi-port SRAM memories.

2. Discussion of the Prior Art

Compileable memories are memories which are custom designed and compiled from basic building blocks termed kernels. Compileable memories are designed or specified to have designated parameters of number of words, word width, and number of bitlines. With those parameters being specified, the design of the compileable memory is then assembled from the building block kernels.

The prior art has used many implementations of redundancy in embedded memories using both spare rows and spare columns. When using both row and column redundancy, a circuit designer must decide how best to implement the repair solution, such that the repair makes optimum use of the spare rows and columns. Some compileable memories have offered spare columns, but have offered no support for self-test, redundancy allocation or steering multiplexors. These memories simply compile an additional data column. For example, if a customer orders a 128K×32 memory, the compiler actually gives the customer a 128K×33 memory. The customer then has to figure out how to test and find the bad column, and also has to implement the steering logic as well as the fusing support circuits.

The prior art has also provided recent developments within ASICs to include row redundancy in compileable memories.

SUMMARY OF THE INVENTION

The present invention relates generally to self-test architectures to implement data column redundancy in a Random Access Memory (RAM), either a Dynamic RAM (DRAM) or a Static RAM (SRAM), and is particularly applicable to compileable memories and to embedded RAM (eRAM) within microprocessor or logic chips. Two passes of self-test are used on a memory. The first pass of self-test determines the worst failing column, the column with the largest number of unique failing row addresses, after which the spare column is allocated to replace the worst failing column. In the second pass of self-test, the BIST (Built In Self-Test) collects unique failing row addresses. At the completion of the second pass of self-test, the spare rows are allocated. Once the second pass of self-test is completed, the column and unique failing row addresses are transported to the e-fuse macros and permanently stored in the chip.

BRIEF DESCRIPTION OF THE DRAWINGS

The foregoing objects and advantages of the present invention for self-test architecture to implement data column redundancy in a RAM may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE INVENTION

The present invention provides a new approach to self-testing, allocating and repairing RAM memories and particularly compileable memories using both spare rows and columns.

The new approach of the subject invention uses two passes of self-test of a memory. The first pass of self-test determines the worst failing column, the column with the largest number of unique failing row addresses. At the completion of the first pass of self-test, the spare column is allocated to replace the worst failing column. In the second pass of self-test, the BIST (Built In Self-Test) collects unique failing row addresses as it does today for memories with spare rows only. At the completion of the second pass of self-test, the spare rows are then allocated. Once the second pass of self-test is completed, the column and unique failing row addresses are transported to the e-fuse macros and permanently stored in the chip.

Figure 1:
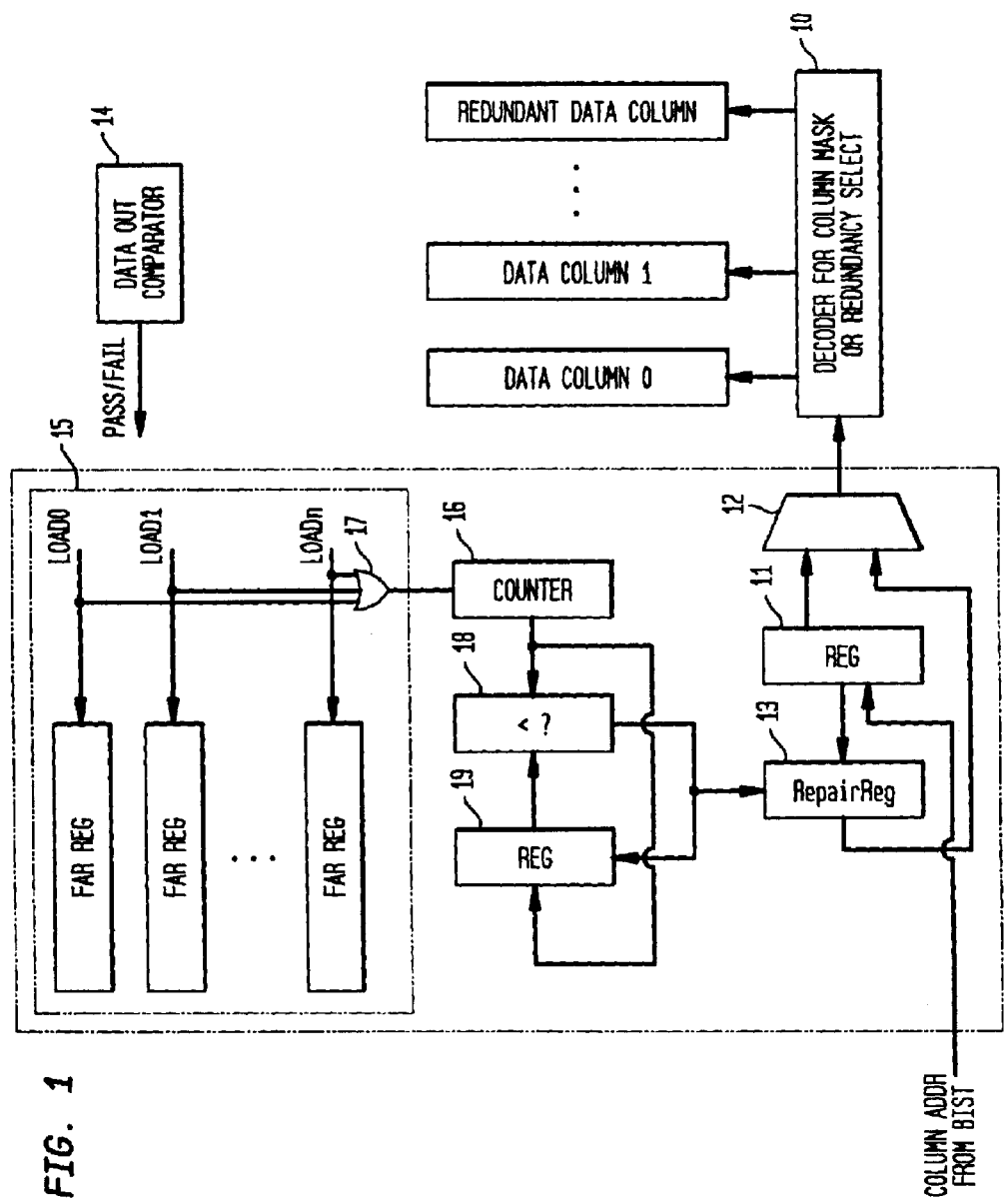
FIG. 1 illustrates the approach of the present invention to determine the worst failing column in the memory in a first pass of self-test, which involves testing one column at a time while counting the number of unique failing rows.

FIG. 1 illustrates the approach of the present invention to determine the worst failing column in the memory in a first pass of self-test, which involves testing one column at a time while counting the number of unique failing row addresses in that column. FIG. 1 illustrates a compileable 1-port SRAM memory having a number of data columns 0, 1, . . . n, and a redundant data column. A decoder 10 (for column mask or redundancy select) is provided to select one of the data columns, including the redundant data column, and to mask all remaining columns.

The BIST generates a column address signal designating a particular column in memory to be selected and tested, which is input to a first register 11. During BIST column testing, the first register outputs the column address signal through a multiplexer 12 to the decoder 10 to select the particular column to be tested. The first register 11 also outputs a worst tested column address signal to a second repair register 13, and in normal operation, the second repair register 13 outputs the stored worst column address signal through the multiplexer 12 which is decoded by the same decoder 10 to implement the redundant data column in place of the worst tested column.

During the first pass of self-test, all columns except the selected tested column are masked or deselected such that only the un-masked or selected column can produce an error in a data-out comparator 14. The pass/fail signal from the dataout comparator 14 is then used to enable the Failing Address Register (FAR) 15 for the selected data column to store each unique failing row address, provided it has not already been stored. The FAR register includes a register entry for row address 0, row address 1 . . . row address n, as indicated schematically in FIG. 1. As the unique failing row addresses are stored, a failing row counter 16 is enabled through an OR gate 17 to count the number of unique failing row addresses for the unmasked column.

At the end of testing of the unmasked column, the count value in the counter 16 for the unmasked column is compared in comparator 18 with a worst count value from previously tested columns stored in an error count register 19. If the count value in the counter 16 for the unmasked column exceeds the previously stored worst count value from previously tested columns, then the unmasked column is determined to be the worst column tested so far. The new count value for the unmasked register is then stored in the error count register 19, and the bit-address of the unmasked data column is stored in the repair register 13. The bit-address is the binary value sent from the self-test circuit to the decoder, such that the decoder's output provides a means to identify and select the un-masked column. The stored count value in register 19 is subsequently compared to the next column's count value after testing is completed on the next column. After testing of each column, the FAR 15 and failing row counter 16 are cleared before testing the next column. At the completion of testing of all columns individually, the worst column's bit-address is stored and saved.

In an alternative embodiment, a circuit could also be implemented that does not allow the use of the spare column unless the worst column's count value exceeds a given threshold value, for example 2.

In embodiments implemented in wide RAMs, the RAM can be divided into sections of adjacent columns, with each section having its own redundant column to replace a worst column in that section, and each section can be tested in parallel with other sections of columns.

In some embodiments, when the number of unique failing row addresses in two columns exceeds the number of redundant rows in the RAM, the RAM is designated as unrepairable. For instance, a flag can be set when the number of unique failing rows in a given column exceeds the number of redundant rows in the RAM, and if a second column exceeds the number of redundant rows in the RAM, and the flag is already set, then the RAM is designated as unrepairable.

Figure 2:
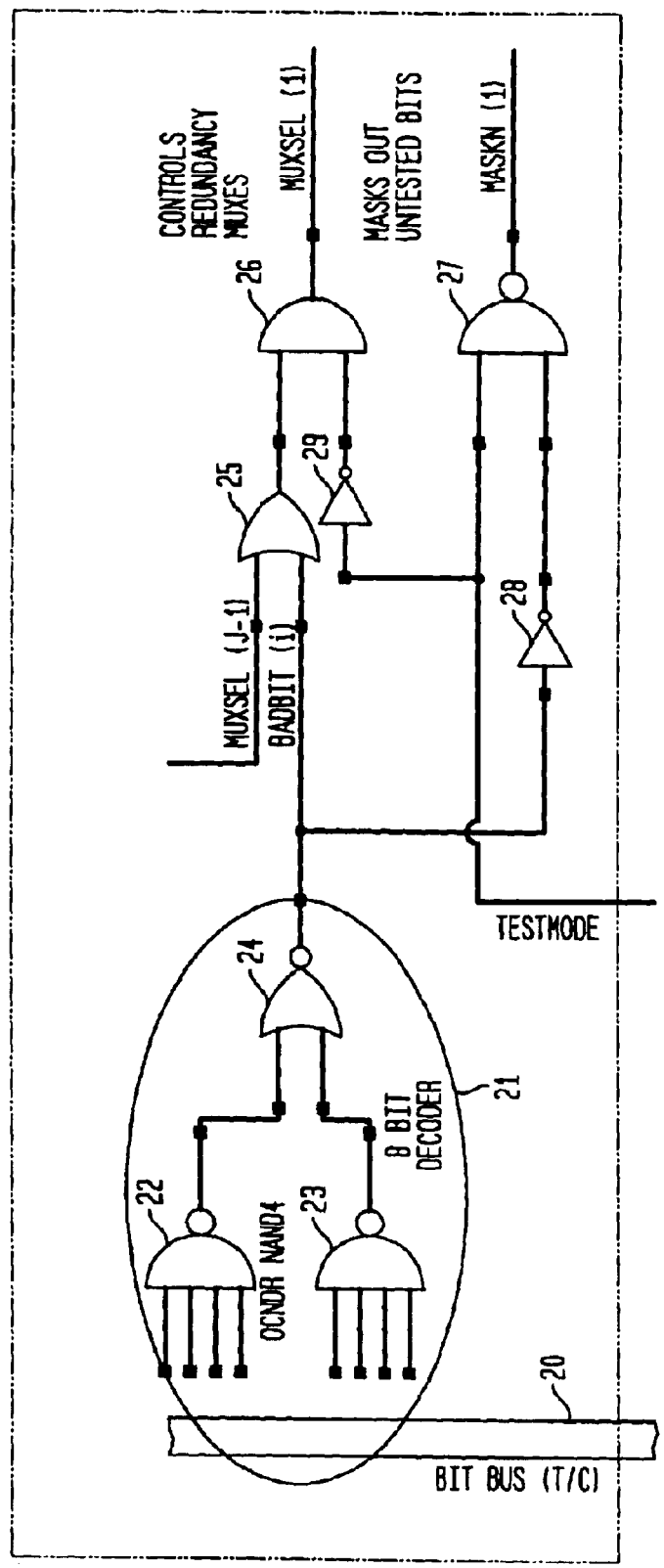
FIG. 2 illustrates further details of a section or bit slice of the decoder for column mask or redundancy select block shown in FIG. 1, which section or bit slice would be provided for each of the columns of the memory.

FIG. 2 illustrates further details of a section or bit slice of the decoder for column mask or redundancy select block shown in FIG. 1, which section or bit slice would be provided for each of the columns of the memory. The bit bus 20 is connected to an 8 bit decoder 21 which comprises first and second NAND gates 22, 23 coupled through a NOR gate 24 which produces an output BADBIT(i), wherein (i) refers to a column designated (i), and (i−1) refers to the immediately preceding column. The output BADBIT(i) is input to an OR gate 25, which receives a second input MUXSEL (i−1), and produces an output to a first AND gate 26. An input TESTMODE, which indicates a test mode as opposed to normal operation, is input to a third NAND gate 27, which also receives the BADBIT(i) signal inverted by an inverter 28 as an input, and produces a MASKN(i) output which serves to mask out untested bits. The TESTMODE signal is also inverted by inverter 29 and the inverted signal is a second input to the first AND gate 26, which produces an output MUXSEL(i) signal to select and control the redundancy mutiplexers provided for the memory.

The stored bit-address value stored in the repair register 13 at the end of the first pass of self-test is then used to enable the spare column, prior to the second pass of the self-test. The same decoder 10 that was used to mask/unmask is then also used to select the steering multiplexors for implementing the spare column, as illustrated in FIG. 2.

Memory cells within the spare column are tested during the second pass during which the FAR is used to collect failing row addresses. At the end of the second pass of self-test, the FAR values are used to allocate and implement the spare rows.

Figure 3:
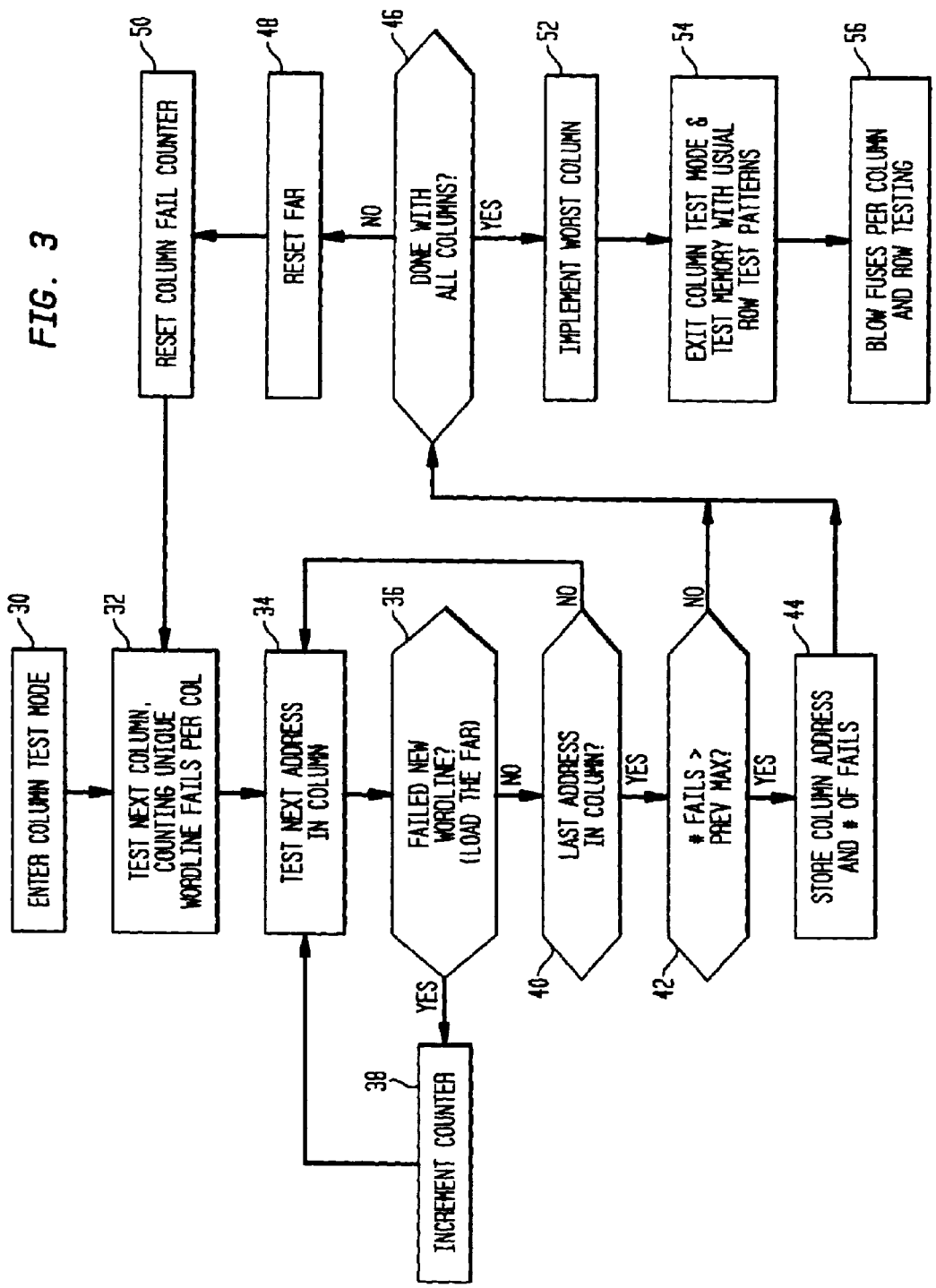
FIG. 3 illustrates a logic flow diagram of the self-test procedure of the present invention.

FIG. 3 illustrates a logic flow diagram of the self-test procedure of the present invention. The system enters the column test mode at 30, indicated by the signal TESTMODE of FIG. 2, and the system proceeds to test the first column at 32, counting the number of unique failing row addresses per column. In the column being tested, each next row address in the column is tested at 34, and at 36 the address of each failed new wordline is loaded into the FAR, and the counter 16 which counts the number of unique failing row addresses is incremented at 38, and the next address in the column is tested until the last address in the column is tested at 40. At 42, if the total number of fails counted by the counter 16 for the tested column exceeds the recorded previous maximum number of fails, then at 44 the column address and number of fails of the tested column are stored in respectively the repair register 13 and the register 19. If at 42 the total number of fails for the tested column does not exceed the recorded previous maximum number of fails, then at 46 the system determines if all columns have been tested. If not, the FAR register is reset at 48 and the column fail counter 16 is reset at 50, and testing of the next column begins at 32. If testing of all columns is completed at 46, the system implements the worst column at 52, substituting the redundant data column for the data column register having the most fails.

The system then exits the first pass of self-test, the column test mode, and proceeds at 54 to the second pass of self-test, to test the memory with usual row test patterns, after which at 56 the results of the column and row testing are permanently implemented and recorded by blowing fuses corresponding to the test results.

While several embodiments and variations of the present invention for self-test architecture to implement data column redundancy in a RAM are described in detail herein, it should be apparent that the disclosure and teachings of the present invention will suggest many alternative designs to those skilled in the art.

What is claimed is:

1. A method for self-testing, allocating and repairing a Random Access Memory (RAM) using a spare data column and spare rows, comprising:

performing first and second passes of self-test on the RAM memory;

in the first pass of self-test, determining a worst failing column of the RAM memory by testing one data column at a time while counting the number of unique failing row addresses of the tested data column by masking all data columns except the tested data column, such that only the un-masked tested data column produces an error in a data-out comparator;

after completion of the first pass of self-test, allocating the spare column to replace the worst failing column;

in the second pass of self-test, determining unique failing row addresses in the memory;

after completion of the second pass of self-test, allocating the spare rows to replace the failing rows.

2. The method of claim 1, wherein after completion of the second pass of self-test, transporting the failing data column and unique failing row addresses to e-fuse macros for permanent storage in the RAM memory.

3. The method of claim 1, wherein a decoder is used to mask all data columns except the tested data column.

4. The method of claim 3, wherein during the first pass of self-test a Built-In Self Test (BIST) generates a data column address signal designating a particular data column in memory to be selected and tested, which in input to said decoder to select the particular data column to be tested, and during normal operation of the RAM a stored worst data column address signal is decoded by decoder to implement the redundant data column in place of the worst tested data column.

5. The method of claim 1, wherein a pass/fail signal from the data-out comparator is used to enable a Failing Address Register (FAR) to store each unique failing row address.

6. The method of claim 5, wherein during the second pass of self-test, the FAR stores unique falling row addresses, and at the end of the second pass of self-test, the FAR values are used to allocate and implement the spare rows.

7. The method of claim 1, wherein as each unique failing row address is stored, a counter is enabled to count the number of unique failing row addresses for the unmasked data column, and at the end of testing of the unmasked data column, if the error count value for the unmasked data column exceeds a previously stored high error count value from previously tested data columns, then the unmasked data column is determined to be the worst data column so far, and the error count value for the unmasked data column is stored in an error count register, and a bit-address for the unmasked data column is stored in a repair register.

8. The method of claim 7, wherein after completion of the first pass of self-test, the stored bit-address stored in the repair register is used to enable the spare data column, prior to the second pass of the self-test, and a decoder is used to select steering multiplexers for implementing the spare data column.

9. The method of claim 1, wherein a Built-In Self Test (BIST) generates a data column address signal designating a particular column in memory to be selected and tested, which is input to a first register which, which during BIST column testing, outputs the data column address signal through a multiplexer to a decoder to select the particular data column to be tested, the first register also outputs the worst tested data column address signal to a second repair register, and during normal operation of the RAM the second repair register outputs the stored worst data column address through the multiplexer to said decoder to implement the redundant data column in plane of the worst tested data column.

10. The method of claim 1, wherein during the first pass of self-test, all data columns except a selected tested data column are masked or deselected such that only the un-masked selected data column can produce an error in a data-out comparator, and a pass/fail signal from the data-out comparator is used to enable a Failing Address Register (FAR) to store each unique failing row address, and a counter is enabled to count the number of unique failing row addresses for the unmasked data column.

11. The method of claim 10, wherein at the end of testing of the unmasked data column, if the count value for the unmasked data column exceeds a previously stored worst count value from previously tested data columns, then the unmasked data column is detennined to be the worst data column so far, the count value for the unmasked data column is stored in an error count register, and a bit-address for the unmasked data column is stored in a repair register.

12. The method of claim 11, wherein after testing of each unmasked data column, the FAR and failing row counter are cleared before testing the next data column, and the stored count value is subsequently compared to a count value for a next data column after testing is completed on the next data column, and at the completion of testing of all data columns, the bit-address of worst data column is stored and saved.

13. The method of claim 1, wherein in wide RAMs, the RAM is divided into sections of adjacent data columns, with each section having its own redundant data column to replace a worst failing data column in that section, and each section is tested in parallel with other sections of data columns.

14. The method of claim 1, wherein when the number of unique failing row addresses in two data columns exceeds the number of redundant rows in the RAM, the RAM is designated as unrepairable.

15. The method of claim 1, performed on an embedded RAM within a microprocessor or logic chip.

* * * * *

UNITED STATES PATENT AND TRADEMARK OFFICE
CERTIFICATE OF CORRECTION

PATENT NO. : 6,928,377 B2
DATED : August 9, 2005
INVENTOR(S) : Eustis et al.

It is certified that error appears in the above-identified patent and that said Letters Patent is hereby corrected as shown below:

Column 5,
Line 19, change "in" to -- is --.

Signed and Sealed this

Twenty-second Day of November, 2005

JON W. DUDAS
*Director of the United States Patent and Trademark Office*